(12) United States Patent
Yoshida

(10) Patent No.: US 7,282,378 B2
(45) Date of Patent: Oct. 16, 2007

(54) METHOD OF MANUFACTURING INSPECTION UNIT

(75) Inventor: Takuto Yoshida, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 76 days.

(21) Appl. No.: 11/259,054

(22) Filed: Oct. 27, 2005

(65) Prior Publication Data

US 2006/0094134 A1 May 4, 2006

(30) Foreign Application Priority Data

Oct. 28, 2004 (JP) .......................... P2004-314229

(51) Int. Cl.
*G01R 31/26* (2006.01)
*H01L 21/66* (2006.01)

(52) U.S. Cl. .......................... 438/18; 438/17; 324/754; 257/48; 257/E21.521; 257/E21.524

(58) Field of Classification Search ................ 324/754; 438/14, 17, 18; 257/698, 710, 787, 789, 257/E23.061, E23.125, E33.057, E33.059, 257/48, E21.251, E21.524
See application file for complete search history.

(56) References Cited

U.S. PATENT DOCUMENTS

| 4,791,248 | A * | 12/1988 | Oldenettel | 174/265 |
| 6,037,787 | A * | 3/2000 | Corwith | 324/754 |
| 6,102,709 | A * | 8/2000 | Howard et al. | 439/66 |
| 6,392,294 | B1 * | 5/2002 | Yamaguchi | 257/690 |
| 6,759,258 | B2 * | 7/2004 | Kasukabe et al. | 438/17 |
| 6,844,748 | B2 * | 1/2005 | Sato et al. | 324/754 |
| 6,953,348 | B2 * | 10/2005 | Yanagisawa et al. | 439/66 |
| 7,057,403 | B2 * | 6/2006 | Kazama | 324/754 |
| 7,102,373 | B2 * | 9/2006 | Yoshida | 324/755 |
| 7,126,362 | B2 * | 10/2006 | Yoshida et al. | 324/754 |
| 2002/0129323 | A1 * | 9/2002 | Kasukabe et al. | 716/4 |

(Continued)

FOREIGN PATENT DOCUMENTS

JP 2001-99889 A 4/2001

*Primary Examiner*—Michelle Estrada
*Assistant Examiner*—Jarrett J Stark
(74) *Attorney, Agent, or Firm*—Morgan, Lewis & Bockius LLP

(57) ABSTRACT

A conductive member having a first face adapted to be mounted on a board on which an inspection circuit is arranged, and a second face adapted to be opposed to a device to be inspected is prepared. The conductive member is formed with a first through hole having a first diameter and communicating the first face with the second face. A contact probe including a tubular body having a second diameter which is smaller than the first diameter, and a plunger retractably projected from one end portion of the tubular body is prepared and disposed in the first through hole. A conductive plate having a second through hole is prepared. Molten resin is injected into the second through hole such that at least a part of inner face of the second through hole is covered with solidified resin, thereby forming a third through hole. The conductive plate is disposed so as to oppose to the second face of the conductive member and to communicate the third through hole with the first through hole. The solidified resin is brought into contact with at least the one end portion of the tubular body so as to coaxially retain the contact probe in the first through hole while only the plunger is projected from the conductive plate.

6 Claims, 4 Drawing Sheets

U.S. PATENT DOCUMENTS

| | | | |
|---|---|---|---|
| 2003/0137316 A1* | 7/2003 | Kazama | 324/761 |
| 2004/0095157 A1* | 5/2004 | Sato et al. | 324/754 |
| 2004/0212381 A1* | 10/2004 | Yoshida et al. | 324/754 |
| 2004/0235207 A1* | 11/2004 | Kasukabe et al. | 438/14 |
| 2005/0001637 A1* | 1/2005 | Kazama | 324/754 |
| 2006/0066330 A1* | 3/2006 | Yoshida | 324/754 |
| 2006/0066331 A1* | 3/2006 | Yoshida et al. | 324/754 |
| 2006/0094134 A1* | 5/2006 | Yoshida | 438/14 |
| 2006/0238210 A1* | 10/2006 | Goto | 324/754 |

* cited by examiner

METHOD OF MANUFACTURING INSPECTION UNIT

BACKGROUND OF THE INVENTION

The present invention relates to a method of manufacturing an inspection unit for a high frequency/high-speed device for ensuring reliable connection between the inspection unit and the device to be inspected, on occasion of inspecting its electrical performance, before a module of a high frequency/high-speed circuit such as an amplifier circuit, a mixer circuit, a filter circuit, a memory, a CPU, etc. or an IC to be incorporated in a mobile phone, for example, has been assembled to a circuit board. In this specification, the term "high frequency" refers to an analogue signal having a high frequency (1 GHz or more), while the term "high-speed" refers to a digital signal having very short pulse width and pulse interval, and both of which are hereinafter collectively referred to as RF (radio frequency).

On occasion of inspecting electrical performance of the RF device such as a semi-conductor wafer, an IC, or a module, insufficient contacts between the terminals may particularly cause fluctuation of impedance or other measurement factors, which may sometimes vary to change measured values. Under the circumstances, such inspection has been conducted by a special inspection unit, for example, as shown in FIG. 6 (disclosed in Japanese Patent Publication No. 2001-99889A). In such an inspection, an RF circuit, which is the device to be inspected, is constructed in a form of a module 50 including an amplifier circuit and a mixer circuit, and is housed in a metal casing for avoiding interference with the exterior. The module 50 includes input and output terminals 51, 54 for RF signals, a power supply electrode terminal 52, and a grounding terminal 53, which are provided on a back face of the metal casing. Then, the inspection is conducted by electrically connecting the terminals to respective terminals of a wiring board 66 on which certain wirings for the inspection are arranged.

In the example as shown in FIG. 6, there are employed contact probes each having a spring and a plunger contained in a metal pipe, one end of the plunger being adapted to be projected to the exterior by the spring and contracted when pushed. The respective electrode terminals are connected by contact probes 63 for RF signals, a contact probe 64 for power supply, and a contact probe 65 for grounding which are contained in a metal block 61 for preventing them from being affected by noises. Each of the contact probes 63 for RF signals is formed in a coaxial structure, using the contact probe as a core conductor and using an inner wall of a through hole in the metal block 61 as an outer conductor, especially for preventing intrusion of noises. In FIG. 6, denoted with numeral 67 is a coaxial cable, and 68 is a plate for pressing the metal pipes surrounding the contact probes. Such a structure around the contact probes is almost the same in a case where an IC socket for inspecting ICs, though such socket has a different outer shape.

Although FIG. 6 shows only two contact probes 63 for RF signals (for input and output), and one each contact probes 64, 65 each for power supply and for grounding, a large number of these contact probes are actually provided in the metal block 61. In the maximum case, the electrode terminals of about 600 pieces per 1 $cm^2$ are provided in a matrix manner with a narrow pitch of about 0.4 mm.

In such the narrow-pitch device, an outer diameter of the contact probe for RF signals including a dielectric layer must be reduced in size. Meanwhile, it is also necessary to adjust the impedance of the coaxial structure formed by the contact probe and the inner wall of the through hole to a predetermined characteristic impedance (50Ω, for example) satisfying the following Equation (1).

$$Zo = \frac{60}{\sqrt{\varepsilon_r}} \log_e \frac{D}{d} \quad (1)$$

where, d is the outer diameter of the core conductor (the contact probe), D is the inner diameter of the outer conductor (the through hole), and $\varepsilon_r$ is a dielectric constant of the dielectric substance between them.

In order to satisfy the Equation (1), it is possible to reduce the inner diameter D of the outer conductor by providing a tube made from dielectric substance with small dielectric constant between each contact probe and each through hole. However, even though a tube of polytetrafuluoroethylene having dielectric constant of 2.1, which is the dielectric substance having the smallest dielectric constant available at present, is employed, and the contact probe having the smallest diameter available (having the outer diameter of 0.15 mm) is employed, the inner diameter of the outer conductor (the inner diameter of the through hole formed in the metal block) requires about 0.5 mm to obtain 50Ω as the characteristic impedance of the coaxial structure This cannot attain the pitch of 0.4 mm.

For the purpose of solving the problem as described above, in a related-art structure, a hollow space is formed between the contact probe and the through hole to obtain the specific dielectric constant of approximately 1, thereby narrowing the pitch. As a retainer for retaining the contact probe at a center of the through hole, in the related-art structure, there are provided metal plates 72 on both faces of a metal block 71 and inserting insulating spacers 73 respectively into dented parts 72a which are formed in the metal plates 72, as shown in FIG. 5A, thereby to fix the contact probe 10. According to this structure, it is possible to make the diameter of the contact probe to be about 0.15 mm, and the inner diameter of the insertion hole 71a to be about 0.35 mm, which can be applied to the pitch of 0.4 mm.

However, this insulating spacer 73 is very small in size, having a thickness t of about 0.6 mm, an outer diameter A of about 0.33 mm, and an inner diameter B of a dented part of about 0.17 mm, as shown in FIG. 5B, and has poor workability. It requires a large number of working steps to accurately produce such a small product having a diameter less than 0.8 mm, either by machine work or by molding work. Moreover, it is difficult to insert the insulating spacer 73, which has been separately prepared, into the dented part 72a of the metal plate 72 and fix it therein. In addition, there is a problem of cost-up, because the production of the insulating spacer 73 is very difficult in view of mechanical strength of the insulating spacer 73. Further, in tendency of narrowing the pitch, it is impossible to prepare the insulating spacer 73 which has a smaller wall thickness than ever. Not only in a case where the contact probe for RF signals in which the coaxial structure is employed, but also in a case where the contact probe for power supply, it is necessary to employ the contact probe having as large diameter as possible for the purpose of decreasing a resistance loss, and the wall thickness of the insulating spacer 73 must be reduced to the limit, so as to comply with the tendency of narrowing the pitch.

SUMMARY OF THE INVENTION

It is therefore an object of the invention to provide an inspection unit which can perform highly reliable inspection without being affected by noises, employing contact probes of a coaxial structure which can be easily manufactured but are not so expensive, even in a case where an inspection is conducted with respect to a device for RF signals in which electrode terminals are arranged with a very narrow pitch as small as 0.4 mm.

In order to achieve the above object, according to the invention, there is provided a method of manufacturing an inspection unit, comprising:

preparing a conductive member having a first face adapted to be mounted on a board on which an inspection circuit is arranged, and a second face adapted to be opposed to a device to be inspected, the conductive member being formed with a first through hole having a first diameter and communicating the first face with the second face;

preparing a contact probe comprising a tubular body having a second diameter which is smaller than the first diameter, and a plunger retractably projected from one end portion of the tubular body;

disposing the contact probe in the first through hole;

preparing a conductive plate having a second through hole;

injecting molten resin into the second through hole such that at least a part of inner face of the second through hole is covered with solidified resin, thereby forming a third through hole; and disposing the conductive plate so as to oppose to the second face of the conductive member and to communicate the third through hole with the first through hole, wherein the solidified resin is brought into contact with at least the one end portion of the tubular body so as to coaxially retain the contact probe in the first through hole while only the plunger is projected from the conductive plate.

With this configuration, an insulating spacer formed by the solidified resin can be made as thin as possible up to the limit that electrical insulation can be obtained. Accordingly, the pitch between the contact probes can be made small. In addition, the same structure can be applied for a contact probe having a small diameter (e.g., a coaxial contact probe for signals) and for a contact probe having a diameter as large as possible (e.g., a contact probe for power supply).

The manufacturing method may further comprises forming a recessed portion on an inner face of the second through hole before the molten resin is injected.

The manufacturing method may further comprises forming a groove on at least one of faces of the conductive plate which are connected by the second through hole before the molten resin is injected, the groove being communicated with the second through hole.

With the above configurations, since the recessed portion and the groove are filled with the molten resin, the solidified resin can be securely fixed to the conductive plate.

The manufacturing method may further comprises forming a resin layer on a face of the conductive plate which is to be opposed to the device to be inspected.

In this case, the resin layer serves as an insulator with respect to the device to be inspected.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE EMBODIMENTS

Embodiments of the invention will be described below in detail with respect to the accompanying drawings.

Figure 1A:
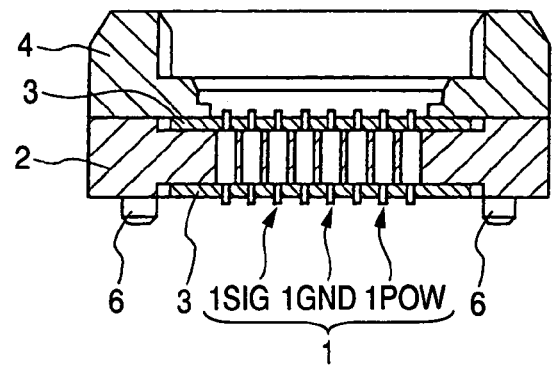
FIG. 1A is a section view of an inspection unit according to a first embodiment of the invention, showing an assembled state thereof.
Figure 1B:
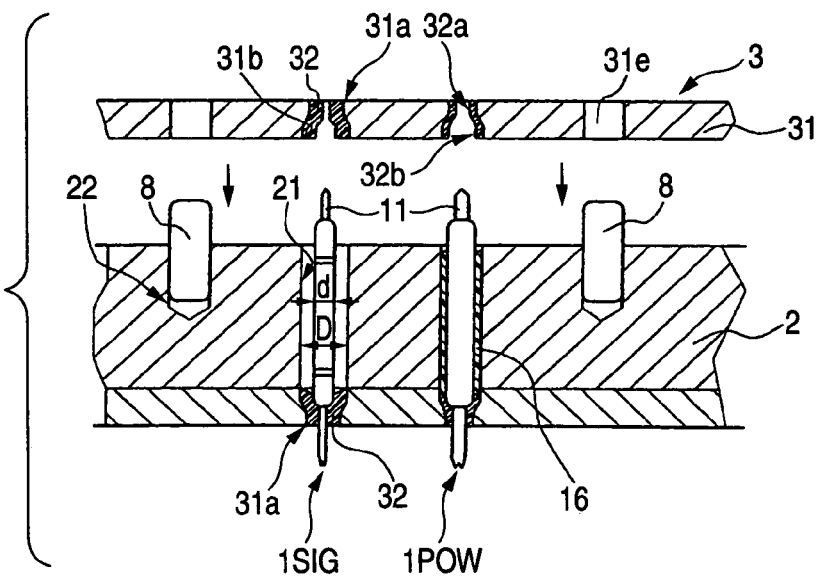
FIG. 1B is an enlarged section view of the inspection unit of FIG. 1A, showing a disassembled state thereof.

As shown in FIG. 1, an IC socket according to a first embodiment of the invention comprises a metal block 2 formed with through holes 21. Within one of the through holes 21, a contact probe 1SIG for RF signals is disposed while leaving a gap, so as to be a core conductor of a coaxial structure, and further, contact probes 1POW, 1GND for power supply and for grounding are respectively provided in other through holes 21 of the metal block 2. A retainer 3 for fixing the contact probes 1SIG, 1POW, 1GND so as not to escape from the metal block 2, while only plungers 11 of the contact probes 1SIG, 1POW, 1GND are projected, is provided on one face of the metal block 2.

In this embodiment, the contact probes 1 (1SIG, 1POW, 1GND) are fixed to the metal plate 2 by the retainer 3, and a device guide plate 4 is mounted thereon. In this IC socket, the contact probes 1SIG, 1POW, 1GND are connected to an inspection board which is not shown, by positioning a plurality of positioning pins 6 provided on the metal block 2 in alignment with predetermined positions of the inspection board, and the IC or the like is inserted into a recess of the device guide plate 4 at the top, whereby electrode terminals of the IC or the like are connected to the contact probes 1 to execute the inspection.

Figure 1C:
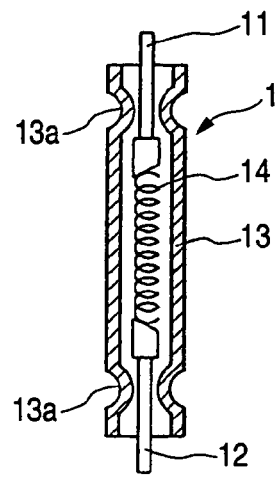
FIG. 1C is a section view of a contact probe in the inspection unit of FIG. 1A.

As shown in FIG. 1C, the contact probe 1 has such a structure that a spring 14 and one ends of the plungers 11, 12 are contained in a metal pipe 13, and the plungers 11, 12 are held so as not to escape from the metal pipe 13 by neck portions 13a formed in the metal pipe 13, and to be urged outwardly by the spring 14. When the tip ends of the plungers 11, 12 are pressed, the spring 14 will be contracted so that the tip ends may be pushed into the metal pipe 13, and while no force is applied, the tip ends of the plungers 11, 12 are projected by about 1 mm, for example. Although the plungers 11, 12 are provided at both ends of the contact probe, depending on the structure of an inspection unit, it may be sufficient that the plunger 11 is provided on at least one side of the contact probe which comes into contact with the device to be inspected.

The metal pipe 13 has a length of about a few millimeters and may be formed of nickel silver (copper, nickel, zinc alloy) for example. As the plungers 11, 12, a wire member having a diameter of about 0.1 mm and formed of SK material or beryllium copper may be used. The spring 14 may be formed of a piano wire or the like.

Although the contact probes 1 have substantially the same structure irrespective of their uses, namely, for signals, for power supply and for grounding, the contact probe 1SIG must be formed in a coaxial structure in combination with an inner wall of the through hole 21 of the metal block 2 which serves as the outer conductor, as described below. For this purpose, an outer diameter d of the contact probe 1SIG and an inner diameter D of the through hole 21 are determined so as to satisfy the above mentioned Equation (1). For example, in the case of the inspection unit in which the contact probes are arranged in a matrix manner with a pitch of 0.4 mm, the outer diameter d is set to be 0.15 mm, and the inner diameter D of the through hole 21 is set to be about 0.35 mm.

On the other hand, the contact probes 1POW, 1GND have preferably as large diameters as possible, and formed in such sizes to be inserted into the through holes 21 having substantially the same size as the through holes 21 which are formed for the RF signals, according to their pitch. In addition, the contact probe 1POW is covered with an insulative tube 16 having such a thickness that the contact probe 1POW may not make a short circuit with the metal block 2. Although not shown, the contact probe 1GND is also covered with a ground tube made of phosphor bronze, for the purpose of improving contact performance with the inner wall of the through hole 21.

The metal block 2 is intended to hold the contact probe 1SIG, the contact probe 1POW, and so on, which are brought into contact with the electrode terminals of the IC or module which is the device to be inspected, while shielding external noises. By forming the metal block 2 by metallic material such as aluminum or brass for example, it is possible to form the coaxial structure including the inner wall of the through hole 21 as the outer conductor and the contact probe 1SIG as the core conductor. Also for the contact probe 1POW, by employing the retainer 3 provided with the insulating spacer 32 which has the small thickness as described above, it is possible to make the contact probe 1POW larger, while keeping the narrow pitch of the contact probes and while shielding the external noises.

Thickness and dimension of the metal block 2 may vary depending on the type of inspection unit into which the metal block is incorporated, for example, an IC socket which simply interconnects the IC and the inspection board provided with wirings, or an inspecting tool connected to the inspection board to which a coaxial cable or the like is connected. However, in general cases, the metal block 2 is formed having a thickness of about 3 to 8 mm, and an area of 30 to 50 mm square.

This retainer 3 includes a metal plate 31 and an insulating spacer 32. The metal plate 31 is formed with through holes 31a through which the plungers of the contact probes 1 are adapted to pass, and dented parts 31b into which shoulder parts of the contact probes 1 (end portions of the metal pipes 13) can be inserted. Insulating spacers 32 are respectively provided inside the dented parts 31b. The insulating spacer 32 is also formed with a through hole 32a which is concentric with the above described through hole 31a and through which the plunger 11 is adapted to pass, and a dented part 32b into which the shoulder part of the contact probe can be inserted, thereby to attain electrical insulation between the contact probe 1 and the metal plate 31.

In this embodiment, the retainer 3 is prepared by forming the through hole 31a through which the plunger 11 of the contact probe 1 can pass, in the metal plate 31 in alignment with the position of the contact probe 1, then, forming the dented part 31b in the metal plate 31 at a side facing the metal block 2 concentrically with the through hole 31a, and by filling the dented part 31b with insulative resin, so that the dented part 32b which is concentric with the though hole 31a and into which the shoulder part of the contact probe 1 can be inserted is formed by the solidified resin.

A process for forming the retainer 3 will be further described in detail, referring to FIGS. 2A to 2E.

Figure 2A:
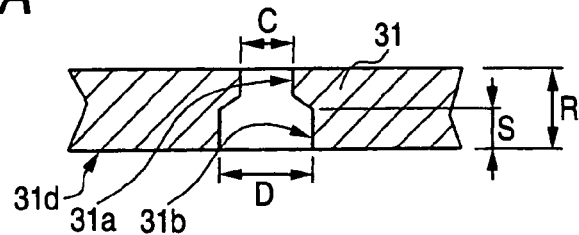
FIGS. 2A to 2E are views for explaining how to manufacture the inspection unit of FIG. 1A.

As a first step, as shown in FIG. 2A, in the metal plate 31 formed of aluminum or brass, for example, and having a thickness R of about 1-5 mm to be attached to one face of the metal block 2, the through holes 31a, each having a diameter C of about 0.25 mm which is larger than a diameter of the plunger 11 so that the plunger 11 of the contact probe 1 can pass through, are formed in alignment with positions of the contact probes 1SIG, 1POW and so on to be provided in the metal block 2. Then, the dented part 31b having an inner diameter D of about 0.35 mm is formed concentrically with the through hole 31a, at a depth S of about 1.3 mm from the face of the metal plate 31 opposed to the metal block 2 (only the though hole 31a and the dented part 31b corresponding to one of the contact probes are shown in this figure).

Figure 2B:
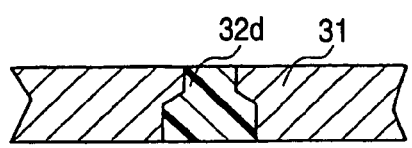
Figure 2C:
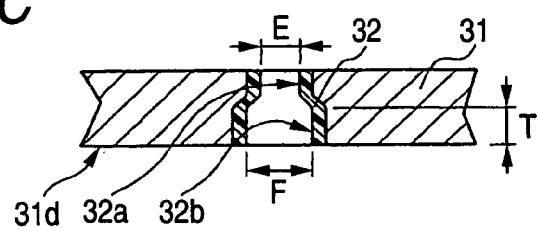
Figure 2D:
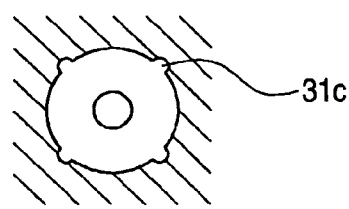

It is preferable that on occasion of forming the dented part 31b, as shown in FIG. 2D, grooves 31c may be formed at one or more positions on an inner face of the dented part 31b along an axial direction of the dented part 31b. This is because rotation of the insulating resin 32d can be prevented, when the through hole 32a and the dented part 32b are formed in the insulating resin 32d by a drill or the like, as described below.

Figure 2E:
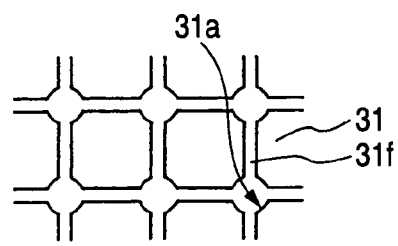

Alternatively or additionally, it is possible to form lattice-shaped grooves 31f, which can be filled with resin, on a surface of the metal plate 31 so as to communicate with the through holes 31a or the dented parts 31b as shown in FIG. 2E. When the lattice-shaped grooves 31f are formed, additional grooves may be formed inside the metal plate 31, so as to extend from inner walls of each grooves 31f in a direction parallel to the surface of the metal plate 31. The additional grooves are filled with resin, thereby forming resin portions inside the metal plate 31 such that each of the additional grooves has a width wider than that of the groove 31f. Such resin portions effectively prevent the insulating resin 32d from not only being rotated but also being moved in a direction perpendicular to the surface of the metal plate 31. The grooves 31f may not be lattice-shaped, but may be parallel grooves extending in one direction of the lattice. In any event, provision of these grooves 31c and/or 31f somehow contribute in preventing the insulating spacer 32 from being escaped from the metal plate 31.

Then, the insulating resin 32d is filled and solidified in the through hole 31a and the dented part 31b of the metal plate 31, as shown in FIG. 2B. As the insulating resin 32d, material which has a small and uniform dielectric constant for dealing with the high-speed or high frequency signals and can be subjected to minute works may be selected. For example, epoxy resin, glass fiber (E-glass) impregnated resin, polyetherimide (PEI), etc. are employed.

Although the through hole 31a of the metal plate 31 is filled with the resin up to the surface of the metal plate 31 as shown in FIG. 2B, the entirety of the dented part 31b need not be filled with the resin. Particularly, a part of the dented part 31b at a side opposed to the metal block 2 need not be filled with the resin. On the other hand, the through hole 31a also need not be filled with the resin along its entire length. That is, it would be sufficient that the insulating spacer 32 is formed only in an area for fixing the shoulder part of the contact probe 1.

Thereafter, as shown in FIG. 2C, the through hole 32a and the dented part 32b are formed in the insulating resin 32d. The through hole 32a having a diameter (E) of about 0.12 to 0.17 mm is firstly formed by a drill by centering it at the center of the through hole 31a of the metal plate 31, from the surface 31d of the metal plate 31 at the side opposed to the metal block, and then, the dented part 32b having an inner diameter F of about 0.17 to 0.33 mm and a depth T of 1.1 mm is continuously formed. Consequently, the insulating spacer 32 which is very thin having a wall thickness of about 0.05 mm is formed in tight contact inside the through hole 31a and the dented part 31b of the metal plate 31. On this occasion, the resin will be also filled in the grooves 31c and/or the grooves 31f if they are formed in the dented part 31b of the metal plate 31, as described above, and therefore, the insulating resin will not be removed from the metal plate 31 nor rotate, even in case where the through hole 32a and the dented part 32b are formed by drilling.

The retainer 3 including the insulating spacer 32 formed in the dented part 31b of the metal plate 31 is attached to one face of the metal block 2, and after the contact probe 1 has been set in the through hole 21 of the metal block 2, the other retainer 3 which has been prepared in the same manner is attached to the other face of the metal block 2, as shown in FIG. 1. In this manner, both ends of the contact probe 1 can be secured by the retainer 3 which has been produced in the above described process, and the contact probe 1 can be held inside the through hole 21 of the metal block 2 with excellent concentricity. Specifically, the shoulder parts of the contact probe 1 are secured by the dented parts 32b of the insulating spacers 32 so that the contact probe 1 may not jump out from the metal block 2 while the plungers 11 are freely projected. For information, numeral 31e represents a through hole for a positioning pin 8.

The metal plate 31 is accurately positioned with respect to the metal block 2 by the positioning pins 8 which are fitted into a positioning hole 22 provided in the metal block 2. It is also possible to insulate the metal block 2 from the metal plate 31 in terms of direct current, by interposing an insulating sheet between them.

Figure 3:
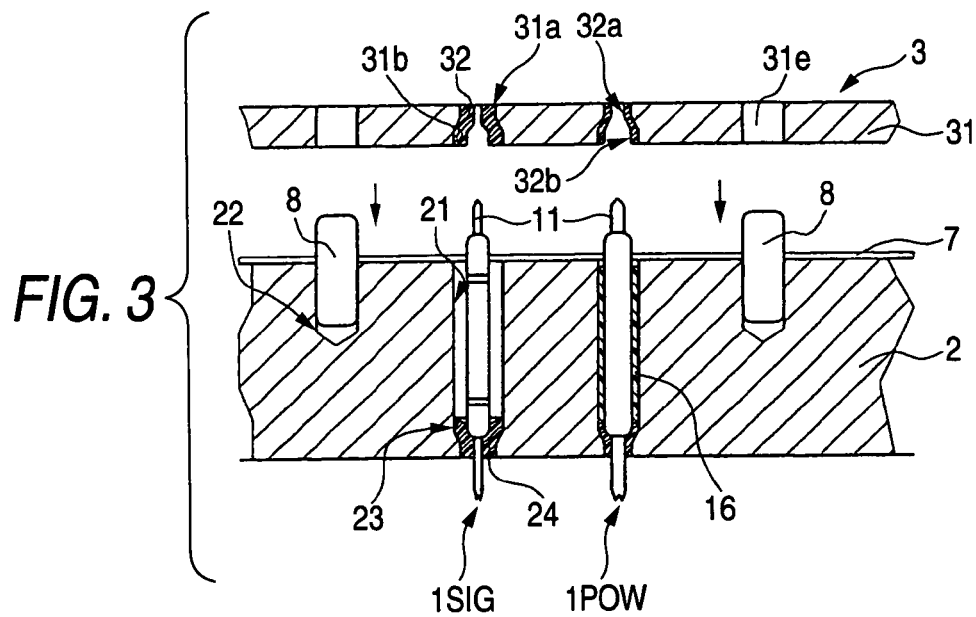
FIG. 3 is a section view of a modified example of the inspection unit of FIG. 1A, showing a disassembled state thereof.

The retainer 3 for the contact probe 1 need not be provided on both the faces of the metal block 2, but such a structure, as shown in FIG. 3, that a dented part 23 is directly formed at the other side of the metal block 2, and an insulating spacer 24 is inserted the dented part 23 may be employed. It is also possible to fix the contact probe 1 directly to the wiring board or the like by soldering or so, without employing the plunger of this type. Further, only one end of the contact probe 1 can be fixed by an insulating board which has been directly formed with a through hole and a dented part. In the embodiment as shown in FIG. 3, an insulating sheet 7 having a thickness of about 75 μm and formed of PEI or the like is inserted between the metal block 2 and the metal plate 31, so that the contact probe 1 may not be inclined when the metal plate 31 is fitted, thus enabling the metal plate 31 to be easily fitted. Even though the insulating sheet 7 is interposed, electrical connection in a form of high frequency is maintained, and the inspection will not at all be hindered. Other elements can be constructed in the same manner as in the conventional inspection unit, as described below.

Figure 4:
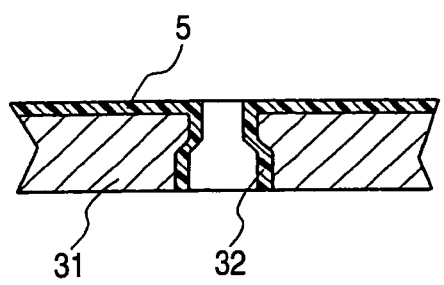
FIG. 4 is an enlarged section view of an insulating spacer in an inspection unit according to a second embodiment of the invention.
Figure 5A:
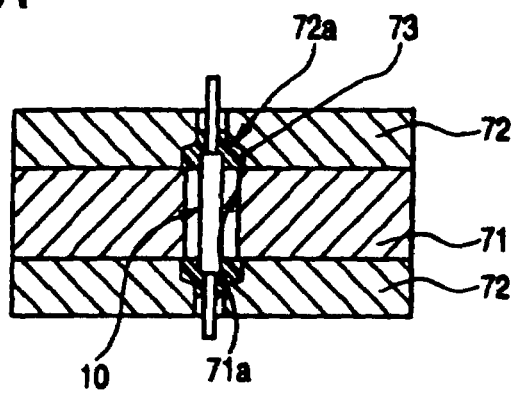
FIG. 5A is a section view of a related-art inspection unit, showing an assembled state thereof.
Figure 5B:
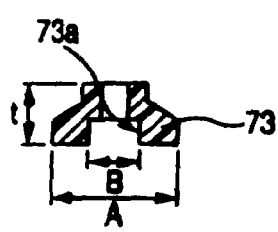
FIG. 5B is a section view of an insulating spacer in the inspection unit of FIG. 5A.
Figure 6:
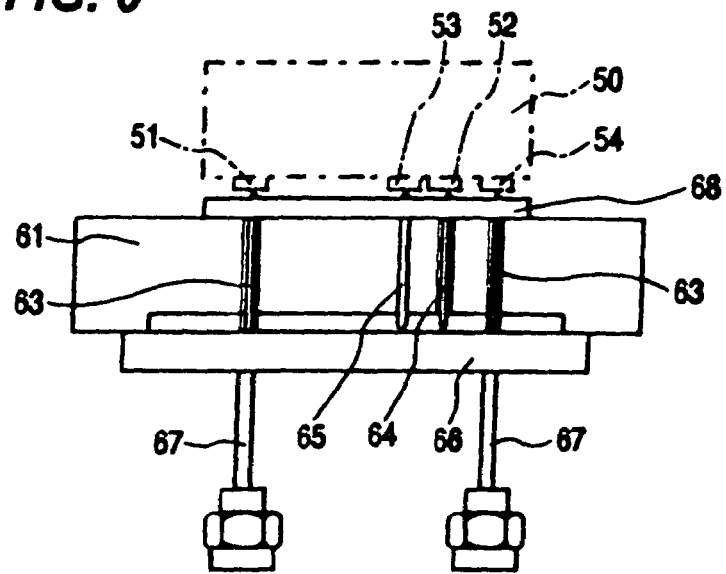
FIG. 6 is a schematic section view of a conventional inspection unit.

Next, a second embodiment of the invention will be described with reference to FIG. 4. Similar components to those in the first embodiment will be designated by the same reference numerals and repetitive explanations for those will be omitted.

In this embodiment, a mold having projecting parts for forming the dented part 32b and the through hole 32a of the insulating spacer 32 is prepared. The metal plate 31 which has been beforehand formed with the dented part 31b and the through hole 31a is positioned in the mold in such a manner that the projecting parts may be aligned with the dented part 31b and the through hole 32a, and then, the resin is filled into the mold and solidified, whereby the insulating spacer 32 can be integrally molded on inner faces of the dented part 31b and the through hole 31a of the metal plate 31. According to this process, secondary work by the drill is not required, and more excellent accuracy than the work by the drill can be obtained.

In this embodiment a resin film 5 having a thickness of 0.1 to 0.2 mm is formed integrally all over the metal plate 31. This resin film 5 serves as an insulating sheet for performing electrical insulation from the device to be inspected or the circuit board which are provided in contact with this face. Conventionally, the insulating sheet such as a PI (polyimide) sheet has been separately attached for performing the insulation, which has been detrimental in respect of cost and dimensional accuracy. However, by employing this process, the insulating film can be formed at the same time with the insulating spacer 32. The resin film 5 can be formed in the same manner, not only in a case where forming the insulating spacer by resin molding, but also in a case where drilling after the resin has been filled, as described above.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A method of manufacturing an inspection unit, comprising:

preparing a conductive member having a first face adapted to be mounted on a board on which an inspection circuit is arranged, and a second face adapted to be opposed to a device to be inspected, the conductive member being formed with a first through hole having a first diameter and communicating the first face with the second face;

preparing a contact probe comprising a tubular body having a second diameter which is smaller than the first diameter, and a plunger retractably projected from one end portion of the tubular body;

disposing the contact probe in the first through hole;

preparing a conductive plate having a second through hole;

injecting molten resin into the second through hole such that at least a part of inner face of the second through hole is covered with solidified resin, thereby forming a third through hole; and disposing the conductive plate so as to oppose to the second face of the conductive member and to communicate the third through hole with the first through hole, wherein the solidified resin is brought into contact with at least the one end portion of the tubular body so as to coaxially retain the contact probe in the first through hole while only the plunger is projected from the conductive plate.

2. The manufacturing method as set forth in claim 1, wherein the retainer is formed by filling the second through hole with the molten resin, and drilling the third through hole in the solidified resin.

3. The manufacturing method as set forth in claim 1, wherein the retainer is formed by:
   preparing a mold having an identical shape with the one end portion of the tubular body and the plunger;
   setting the mold in the second through hole;
   filling the second through hole with the molten resin; and
   removing the mold after the molten resin is solidified, thereby forming the third through hole.

4. The manufacturing method as set forth in claim 1, further comprising: forming a recessed portion on an inner face of the second through hole before the molten resin is injected.

5. The manufacturing method as set forth in claim 1, further comprising: forming a groove on at least one of faces of the conductive plate which are connected by the second through hole before the molten resin is injected, the groove being communicated with the second through hole.

6. The manufacturing method as set forth in claim 1, further comprising: forming a resin layer on a face of the conductive plate which is to be opposed to the device to be inspected.

* * * * *